United States Patent [19]
Bunza

[11] Patent Number: 5,838,948
[45] Date of Patent: *Nov. 17, 1998

[54] SYSTEM AND METHOD FOR SIMULATION OF COMPUTER SYSTEMS COMBINING HARDWARE AND SOFTWARE INTERACTION

[75] Inventor: Geoffrey J. Bunza, Beaverton, Oreg.

[73] Assignee: Eagle Design Automation, Inc., Beaverton, Oreg.

[ * ] Notice: This patent issued on a continued prosecution application filed under 37 CFR 1.53(d), and is subject to the twenty year patent term provisions of 35 U.S.C. 154(a)(2).

[21] Appl. No.: 566,401

[22] Filed: Dec. 1, 1995

[51] Int. Cl.$^6$ ........................................ G06F 9/455
[52] U.S. Cl. ..................... 395/500; 395/920; 364/578
[58] Field of Search ................... 395/500, 561, 395/568, 920, 921; 364/578

[56] References Cited

U.S. PATENT DOCUMENTS

| | | | |
|---|---|---|---|
| 4,638,423 | 1/1987 | Ballard | 364/200 |
| 5,077,657 | 12/1991 | Cooper et al. | 395/500 |
| 5,459,872 | 10/1995 | Connell et al. | 395/736 |
| 5,493,672 | 2/1996 | Lau et la. | 395/500 |
| 5,546,562 | 8/1996 | Patel | 395/500 |
| 5,551,013 | 8/1996 | Beausoleil et al. | 395/500 |
| 5,572,710 | 11/1996 | Asano et al. | 395/600 |
| 5,574,927 | 11/1996 | Scantlin | 395/800 |
| 5,600,579 | 2/1997 | Steinmetz, Jr. | 364/578 |

FOREIGN PATENT DOCUMENTS

WO 95/26000  9/1995  WIPO ............................. G06F 9/455

OTHER PUBLICATIONS

Goering, Richard, "Mentor targeting ESDA," Electronic Engineering Times, p. 54, May 31, 1993.
Huber, John P., and Mark W. Rosneck, Successful ASIC Design the First Time Through, Van Nostrand Reinhold, New York, 1991, pp. 77–109.
Shelor, C.F., "VHDL Designer," VHDL Times, VI Home Page [Online] . Available HTTL://www/cfshelor@acm.org [publication date unknown].
Nohau Corporation, "EMUL68–PC: Development System for the 68HC11 Family," [Product Brochure], Nohau Corporation, Campbell, CA, [publication date unknown].
Quickturn Design Sytems, Inc., "HDL–ICE™ ASIC Emulation System," [Product Brochure], Quickturn Design Systems, Inc., Mountain View, CA, [publication date unknown].
Nu Thena Systems, Inc. and Lynx Real–Time Systems, Inc., "Nu Thena Systems Foresight System Modeler," IKOS Systems, Inc. Cupertino, CA [Online]. Available HTTP:// www.WebMaster@ikos.com [publication date unknown].

(List continued on next page.)

*Primary Examiner*—Kevin J. Teska
*Assistant Examiner*—Tyrone V. Walker
*Attorney, Agent, or Firm*—Seed and Berry L.L.P.

[57] ABSTRACT

A system for simulation of target electronic systems combining interacting elements of hardware and executing software, in part by physical emulation means and in part by abstract software simulation. A processor emulator is coupled to a hardware simulator by a communications link. The processor emulator provides the functionality of the target microprocessor while the hardware simulator simulates additional target circuitry. The processor emulator is coupled to a memory containing the target program. Most computer instructions in the target program do not require interaction with the target circuitry simulated on the hardware simulator. However, when a computer instructions requires the interaction of the target microprocessor and the target circuitry, a communications link control the communication between the target microprocessor and the target circuitry. The various components of the system can be coupled together via a conventional computer network. A translator/mapper translates the computer data requiring the interaction between the target microprocessor and the target circuitry from the data format of the emulator to the data format of the hardware simulator. The translated data is then mapped to a set of simulated pins on a processor model shell in the hardware simulator.

62 Claims, 11 Drawing Sheets

OTHER PUBLICATIONS

Alta Group, "Alta Group Announces Convergence* Simulation Architecture Supporting Full–System, Mixed–Level Verification," [Online] Press Release by Diane Orr at Tsantes & Associates, (Tel: 408–452–8700; email: 6546089@mcimail.com), [publication date unknown].

Hemani, Ahmed (editor), "Summary of Publications and Presentations From ESDLAB," [Online]. Available HTTP://www/ahmed@ele.kth.se [publication date unknown].

VTT, Technical Research Centre of Finland, "Other Projects in 1993: KOMPLEKS (Simulation and Verification Methods of Complex Systems), TECHOANA3 (Analog Systems Design Methodology: Power Electronics), DSP Hardware Optimization, DSP Emulation Hardware—BOAR," [Online]. Available HTTP://www/jps@vttoulu.vtt.fi [publication date unknown].

VTT, Technical Research Centre of Finland, "A Unified Environment For Cosimulation And Cosynthesis OF Mixed Hardware/Software Systems (94)" [Online]. Available HTTP://www/jps@vttoulu.vtt.fi [publication date unknown].

VTT, Techincal Research Centre of Finland, "VTT Electronics: The Cobra Project" [Online] Available HTTP://www/jps@vttoulu.vtt.fi [Oct. 24, 1995].

Pregernig, L., "Executable System Specifications," paper presented at CERN, European Laboratory for Particle Physics, Schweizer Automatik Pool Forum 21, Zurich, Switerland, Mar. 9–10, 1993.

Quickturn Design Systems, Inc., "The System Realizer™ Family of Modular Emulation Systems: Manage the Complexity Level of Deep Submicron Designs," [Product Brochure], Quickturn Design Systems, Inc., Mountain View, CA, [publication date unknown].

Mentor Graphics Corporation, "System Design Station including System Architect," [Product Brochure], Mentor Graphics Corporation, Wilsonville, Oregon, 1993.

Mentor Graphics Corporation, "EDA Select Catalog 1994: Solutions for the Business of Electronic Design," [Product Catalog], Mentor Graphics Corporation, Wilsonville, Oregon, 1994.

Microtek, "MICE–V–386: First In Feature, First In Speed," [Product Brochure], Microtek International, Inc., Hillsboro, OR, 1990.

Cadence, "Systems in Silicon and Silicon in Systems," [Conference Brochure], Design Automation Conference, Cadence Design Systems, Inc., San Jose, CA, 1994.

Vertal, Michael D., "Extending IDEF: Improving Comple Systems With Executable Modeling," presented at The 1994 Annual Conference for Business Process Reengineering, IDEF Users Group, Richmond, VA, May 1994.

Benslama, K., et al., "Modeling and Simulating Time–Dependent Systems Practical Experience," presented at the 1994 SCS Simulation Multiconference, La Jolla, CA, Apr. 11–15, 1994.

Nu–Thena Systems, "Foresight: Modeling Simulation, Prototyping," [Product Brochure], Nu Thena Systems, Inc., McLean, VA, 1993.

Cadence, "SpectreHDL analog behavioral simulation system," [Product Annoucement], Electronic News, 40:6, Aug. 1, 1994.

Maliniak, Lisa, "Multiprocessing verilog simulator exploits the parallel nature of HDLs," Electronic Design, 42:41, May 30, 1994.

Maliniak, Lisa, "ESDA boosts productivity for high–level design," Electronic Design, 41:125, May 27, 1993.

Smith, Rexford L., "Proof of performance, without hardware," Design News, 48:102, Aug. 24, 1992.

Maliniak, Lisa, "Synthesis tools move into the mainstream," Electronic Design, 39:51, Aug. 22, 1991.

Valid Logic Systems, Inc., "Logic Workbench: Valid adds top–down design environment," [Product Annoucement], Chilton's Electronic News, 37:30, Jun. 3, 1991.

Maliniak, Lisa, "Hardware, software simulators blend seamlessly. Cadence Design Systems Inc.'s XLProcessor gate–level accelerator," [Product Annoucement], Electronic Design, 39:133, May 23, 1991.

Conner, Doug, "ESDA Tools," EDN, 39:80, May 26, 1994.

HEI Corporation, "Software simulates automated systems," Machine Design, 66:38, Mar. 21, 1994.

Maliniak, Lisa, "VHDL moves beyond simulation," Electronic Design, 42:20, Jan. 24, 1994.

Conner, Doug, "Design tools speed presynthesis system design. Redwood Design Automation's Reveal interactor and Race simulator," EDN, 38:85, May 27, 1993.

Maliniak, Lisa, "Efficient debug wipes out productivity bottlenects," Electronic Design, 43:48, Jul. 10, 1995.

Novellino, John, "Software targets test bottlenect," Electronic Design, 42:63, Nov. 7, 1994.

Eiler, Mary Ann, "EDI and the technical communicator," Technical Communication, p. 672, Nov., 1994.

Bartleson, Karen, "VHDL emerges as a commercial design tool," EDN, 39:84, Aug. 18, 1994.

Wyatt, Michael, "Spice runs thermal analysis. MicroSim Corp.'s Pspice program," EDN, p. 94, Aug. 18, 1994.

Maliniak, Lisa, "DAC focuses on synthesis and ESDA tool advances," Electronic Design, 45:51, May 30, 1994.

HEI Corporation, "Software simulates automated system. HEI Corp.'s Automation Master program," Machine Design, 66:38, Mar. 21, 1994.

Control Data Systems, "Software gives developers a fast start. Control Data Systems, Inc.'s Integrated Computer–Aided Eingineering and Manufacturing programs," Machine Design, 66:76, Mar. 21, 1994.

Maliniak, Lisa, "EDA tools zero in on DSP design; automate DSP tasks that span algorithm development to physical design," Electronic Design, 42:51, Mar. 7, 1994.

Hymowitz, Charles, "Step–by–step procedures help you solve Spice convergence problems," EDN, 39:121, Mar. 3, 1994.

Maliniak, Lisa, "ESDA boosts CAE technology to higher levels," Electronic Design, 41:61, Dec. 2, 1993.

Ballou, Melinda–Carol, "Information Builders to broaden EDA/SQL," Computerworld, 27:29, Nov. 29,1 993.

Burrows, Peter, "Top–down design disppoints the designer," Electronic Business, 19:80, Feb., 1993.

Holden, Dan, "EDA consortium unveils interoperability spec," Electronic News, 39:2, Feb. 1, 1993.

Strassberg, Dan, "Tools for CPU32 series are fully integrated", EDN 37:56, Jul. 6, 1992.

| Mnemonic | Instr# | Data | Adr1 | Adr2 | Intrpt | Blocking |
|---|---|---|---|---|---|---|
| idle | 0 | 0 | 0 | 0 | I | no |
| bus_request | 1 | X | X | X | I | no |
| mem_read8 | 2 | <u8 | loc | 0 | I | yes |
| mem_read16 | 3 | <u16 | loc | 0 | I | yes |
| mem_read32 | 4 | <u32 | loc | 0 | I | yes |
| mem_read64 | 5 | <u64 | loc | 0 | I | yes |
| io_read8 | 6 | <u8 | loc | 0 | I | yes |
| io_read16 | 7 | <u16 | loc | 0 | I | yes |
| io_read32 | 8 | <u32 | loc | 0 | I | yes |
| io_read64 | 9 | <u64 | loc | 0 | I | yes |
| mem_write8 | 10 | u8 | loc | 0 | I | no |
| mem_write16 | 11 |  | loc | 0 | I | no |
| mem_write32 | 12 | u32 | loc | 0 | I | no |
| mem_write64 | 13 | u64 | loc | 0 | I | no |
| io_write8 | 14 | u8 | loc | 0 | I | no |
| io_write16 | 15 | u16 | loc | 0 | I | no |
| io_write32 | 16 | u32 | loc | 0 | I | no |
| io_write64 | 17 | u64 | loc | 0 | I | no |
| *unused* | 18 | X | X | X | I | no |
| interrupt_start | 19 | X | X | X | I | no |
| interrupt_end | 20 | X | X | X | I | no |
| halt | 21 | 0 | 0 | 0 | I | no |
| reset | 22 | 0 | 0 | 0 | I | no |
| set_int_level | 23 | u32 | 0 | 0 | I | no |
| block_move | 24 | cnt | src | dst | I | no |
| block_compare | 25 | cnt | >src <boolean | dst | I | yes |
| read_pins | 26 | set | >0 <bits | 0 | I | yes |
| *processor specific ops* | 4096+ | ? | ? | ? | ? | ? |
| *internal commands* | bit 30 set |  |  |  |  |  |
| *debug commands* | bit 31 set |  |  |  |  |  |

*FIG. 7*

SYSTEM AND METHOD FOR SIMULATION OF COMPUTER SYSTEMS COMBINING HARDWARE AND SOFTWARE INTERACTION

TECHNICAL FIELD

The present invention relates generally to computer hardware simulators, and, more specifically, to a system and method for the simulation of systems that combine hardware and software interaction.

BACKGROUND OF THE INVENTION

The use of computer simulation has become widespread in many areas such as circuit design. The cost of manufacturing an integrated circuit is extremely high, and it is desirable that the hardware incorporated into the integrated circuit be tested prior to the actual fabrication of the chip. To that end, integrated circuit manufacturers often use simulators to test the hardware and the software intended to be executed by the hardware. The desired hardware design is designated as the target hardware, while the software intended to be executed by the target hardware is designated as the target program.

There are several techniques that are used to simulate the target hardware and software. One approach is to simulate the hardware using a computer hardware simulator. The hardware simulator is a software program that simulates the responses of the target hardware and is implemented entirely in software. Thus, in the hardware simulator, the target hardware and target program are simulated entirely by computer software. Another approach uses a microprocessor emulator to model a microprocessor that is typically part of the target hardware and used to execute the target program. Thus, the target program and portions of the target hardware are simulated by hardware devices such as the processor emulator.

Each of the above-described approaches has advantages and disadvantages. The hardware simulator is extremely slow and cumbersome, particularly when used to simulate a complex microprocessor executing a target program. Thus, testing a complete target program is impractical due to the extremely long execution times required by the typical hardware simulator. The processor emulator is able to execute a target program much faster than the hardware simulator but requires the development of external circuitry that is expected to interact with the target microprocessor. Therefore, it can be appreciated that there is a significant need for a system that allows complete testing of the target hardware and software with efficiency and low cost. The present invention provides this and other advantages, as will be illustrated by the following description and accompanying figures.

SUMMARY OF THE INVENTION

The present invention is embodied in a system and method for testing and analyzing electronic systems, including a target microprocessor and simulated target circuitry, and accompanying target software to be executed on the target microprocessor. The system comprises a memory storing a plurality of computer instructions, including the target software and a processor emulator employing a hardware device for emulating the microprocessor. The processor emulator is coupled to the memory to execute the computer instructions. A hardware simulator is coupled to the processor emulator to simulate the target circuitry. A communications interface controls communication between the memory, the processor emulator, and the hardware simulator. The processor emulator communicates with the memory to receive the computer instructions and communicates with the hardware simulator using the communications interface only on an occasion when the target software requires interaction with the target circuitry.

The processor emulator may be coupled to the hardware simulator by computer network connection, with the communications interface controlling communications over the network. The system may also include an exception detector coupled to the processor emulator to detect the occasion requiring the target software to interact with the target circuitry. The exception detector may temporarily halt execution of the plurality of computer instructions while the hardware simulator processes the occasion requiring the target software to interact with the target circuitry. The occasion requiring the target software to interact with the target circuitry may be an input/output (I/O) instruction to the hardware simulator, with the communication interface controlling communication of the I/O instruction from the processor emulator to the hardware simulator.

The processor emulator typically utilizes a first data format, and the hardware simulator uses a second data format. The system includes a translator to convert an event requiring the target software to interact with the target circuitry from the first data format to the second data format for events requiring interaction. The hardware simulator may contain a processor model shell to simulate the target circuitry. In such circumstances, the system also includes a mapper to map the event type to a set of signal sequences compatible with the processor model shell. The processor emulator may be coupled to the translator and mapper by a first computer network connection, with the communications interface controlling communication over the first network connection. The translator and the mapper may be coupled to the hardware simulator by a second computer network connection, with the communications interface controlling communication between the processor emulator and the hardware simulator over the first and second network connections. In a preferred embodiment, the mapper may directly determine the event type and map the event type into a set of signals compatible with the hardware simulator without the need of a translator.

In one embodiment the processor emulator is a microprocessor emulator with the memory integrated therein with the integrated memory containing the computer instructions. In an alternative embodiment the processor emulator is a hardware circuit emulator with memory integrated therein, with the integrated memory containing the computer instructions.

In another alternative embodiment, the system includes first and second target microprocessors each having a memory storing a set of computer instructions to be executed on the respective target microprocessors. In this embodiment, the communications interface controls communication from the first and second processor emulators to the hardware simulator. The first and second processor emulators communicate with the first and second memories, respectively, to receive the first and second sets of computer instructions therefrom. The first processor emulator communicates with the hardware simulator using the communications interface only on an occasion when the target software for the first target microprocessor requires interaction with the target circuitry and the second processor emulator communicates with the hardware simulator using the communications interface only on an occasion when the target software for the second target microprocessor requires interaction with the target circuitry.

The dual target processor embodiment may also include first and second portions for the communications controller, with the first communications controller portion being operatively coupled to the first processor emulator to control communication between the first processor emulator and the hardware simulator only on the occasions when the target software for the first target microprocessor requires interaction with the target circuitry. The second communications controller portion is operatively coupled to the second processor emulator to control communications between the second processor emulator and the hardware simulator only on occasions when the target software for the second target microprocessor requires interaction with the target circuitry. In this embodiment, the first and second processor emulators may be microprocessor emulators or hardware circuit emulators.

BRIEF DESCRIPTION OF THE DRAWINGS

FIG. 7 is a table of processor operations which are used as part of a communications protocol with the system of FIG. 6.

DETAILED DESCRIPTION OF THE INVENTION

Figure 1:
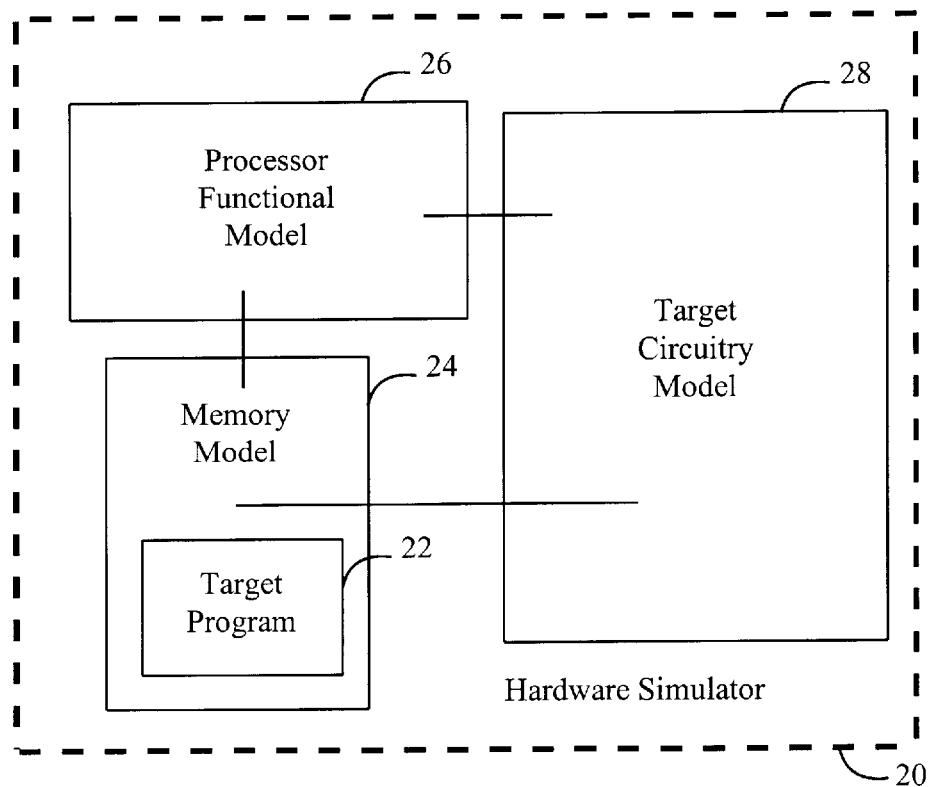
FIG. 1 is a functional block diagram of a traditional hardware simulator employing a processor functional model to simulate target program execution.

With the advent of 32-bit microprocessors and complex operating software, embedded systems have become very complex systems. The vast majority of electronic products built today include some form of computer hardware executing a stored software program. An embedded system may typically include a microprocessor executing instructions and interacting with an application specific integrated circuit (ASIC) or a custom Integrated Circuit (IC). The microprocessor used in the system is designated herein as a target microprocessor. The external circuitry that interacts with the target microprocessor, whether it is the ASIC, custom IC, or some other form of electronic circuitry, is designated herein as the target circuitry. The combination of the target circuitry and the target microprocessor is designated herein as the target hardware. The software program that is intended to be executed by the target microprocessor is designated herein as the target program.

Given the complexity and density of modern electronics designs, it is desirable that the first system prototype, including the target hardware and the target program, is typically close in form, fit, and function to the end product. The target hardware prototypes would therefore include the ASIC and custom IC designs, which were fabricated and passed their respective qualification and acceptance tests at the foundry.

With respect to the target program, code is typically designed, written, and tested, module by module. The module integration process also involves testing of the integrated software modules. However, because the target hardware may not be available at the time of the software development, it is not possible to test the interaction of the target hardware and the target program. To substitute for the missing target hardware, pieces of the design are "stubbed out," or mockups built to substitute for anticipated missing parts of the target hardware. The term "stubbed out" refers to a mock response to a program call to a location in the yet unbuilt circuitry. The programmer must program a return command that causes the target program to ignore the lack of a true response from the target circuitry. The substitution of mocked up target hardware requires further interpretation of the original hardware design specifications. It is common to find that no single combined software system integration occurs before the software is loaded onto the hardware prototype, let alone tested as a whole (stubbed out or otherwise).

When software engineers start work, the physical target hardware which will ultimately execute the target program does not exist. The target program can be cross-compiled onto an existing system for testing, and the hardware-dependent parts of the target program can be emulated with other software modules. Typically, this entails writing simulated hardware functions to simulate the low-level interaction with the target hardware, allowing a "black-box" approach to the design. Thus, a particular software function can be written to simulate a response expected from the target hardware. If the projected target hardware changes, then only the particular simulated hardware function need be modified. The rest of the simulation program remains unchanged. This approach also allows some conceptual testing to occur. However, the ability to emulate the target hardware in custom software modules is normally very limited. It can be a lengthy modeling task to write an equivalent functional module of the unbuilt target hardware. It can be an even larger task to verify that the software module provides compatible responses to the target hardware circuit because the software module is simply the programmer's interpretation of the original system specifications. The target program is not normally used with this approach, unless the development system happens to be the expected target computer system to some large extent.

Typically, the hardware and software components of a target system design are brought together for the first time when the prototype target hardware has been fabricated. Because of the prior unavailability of the actual target hardware, one often finds that the target program loaded at the time of the integration of the prototype target hardware and software does not work. It is common to find that the integration problems are strictly due to software complications alone. This may cause a significant delay in the software development due to the problems in the target program. Other problems with the integration may be caused by the interaction of the target hardware with the target program. Consequently, considering the large cost of ASIC and custom IC design, and the relatively low cost ease of software modification, it is common that the software will be force-fitted to the target hardware prototype, thereby increasing the overall planned software development time.

The target hardware can be simulated at the chip, board, and system level to varying extents. Because of the availability of simulated target hardware, there is a significant benefit to including the target program in a system simulation, including the chance to debug code and verify the correct operation of both the target program and target hardware before the target hardware is built. Problems associated with the interaction between the target hardware and the target program can be detected and corrected before final hardware fabrication, often saving costly and time-consuming redesign of the ASIC.

Current technology facilitates only primitive and low performance hardware and software simulation. Large amounts of processing power are required to simulate a microprocessor executing a few hundred lines of the target program code. Traditional hardware simulated microprocessors execute approximately –4 microprocessor instructions per second, which barely allows for a system to boot itself up. Meaningful system simulations, where significant amounts of target program code are to be executed, require massive computing resources.

The target hardware prototype is built in order to verify that the target program runs with the custom designed target circuitry and target microprocessor. One issue in using the target hardware prototype is the loss of debug visibility once the prototype is built. As those skilled in the art can readily appreciate, the typical embedded system does not have any debugging and control capabilities. When errors are detected in the prototype target system, there are no facilities to utilize the software development tools required to debug, analyze and correct the problems. A loss of visibility refers to the inability to examine the contents of internal registers, memory locations, and the like. The prototype hardware also lacks debugging control ability, which is the ability to control the flow of the target program using start and stop command, single step commands, and the like.

A brief discussion of conventional simulation systems will serve to distinguish the present invention. Conventional simulations systems can be categorized as hardware, software, or a combination. The "brute-force" hardware simulation method of verifying the target system, illustrated in FIG. 1, uses a hardware simulator 20. The hardware simulator 20 is a software program that accepts a description of the target hardware, including electrical and logical properties of the target microprocessor and the target circuitry. The target hardware design may be specified graphically by schematic diagrams or by a hardware description language (HDL), such as VHDL. The hardware simulator 20 is a commercially available product.

The hardware simulator 20 simulates signal propagation and logical functionality of the target hardware event by event. It should be noted that a typical microprocessor instruction cycle is actually the result of a large number of hardware events within the target. Thus, the hardware simulator 20 attempts to represent signal timing, signal strength, and logical function as accurately as possible, often enabling sub-nanosecond timing accuracy in simulating these hardware events. To achieve this degree of accuracy for a highly complex target microprocessor, functions are often represented with detailed structures, although most hardware simulators allow multiple levels of modeling abstraction from a switch or transistor level model to a high level behavioral model.

A target program 22 is compiled into object code, and the object code is downloaded into a processor memory model 24 within the hardware simulator 20. A processor functional model 26 is a software description, including the electrical and logical properties, of the target microprocessor, while a target circuitry functional model 28 provides a model of the target circuitry, such as an ASIC, or other custom or semi-custom design. The hardware simulator 20 allows the processor functional model 26 to simulate execution of the target program 22 event by event. As discussed above, the processor functional model 26 and the target circuitry functional model 28 can be specified to various levels of abstraction by a conventional HDL.

There are disadvantages in using the hardware simulator 20 to simulate the target hardware. Microprocessor manufacturers are cautious about providing the full-functional processor model 26 that could be reverse-engineered into a competitive product. In addition, the full-functional processor model 26 can be extremely detailed for a complex circuit such as the target microprocessor. For an accurate simulation, the hardware simulator 21 must simulate all activity that occurs in the target microprocessor using the processor functional model 26 to detect timing errors, race conditions, and the like. This requires many processor cycles in the hardware simulator 20 to simulate each instruction of the target program 22 by the target hardware. The execution time required to simulate the full-functional processor model 26 can add significantly to the simulation run-times. The target program 22 can be quite long. The additional burden of trying to run longer simulation required for larger target program 22 into the processor memory model 24 can consume large amounts of system resources, and simulation run time can become unacceptably long. Typical simulation speeds may only reach 2–4 microprocessor instructions per second.

If the target program 22 malfunctions, then the programmer has the unenviable task of debugging the target program and relating the object code locations back to some high-level program statements outside the typical software development environment. This debugging task must typically be accomplished without the aid of debuggers or any other software design and analysis tools.

Variations on the use of the full functional model 26 in the hardware simulator 20 include a trade-off in both timing accuracy and gross functionality. To speed the overall hardware simulation, timing accuracy is sometimes only maintained for major processor or bus cycles, reducing the overall number of simulated events. However, the loss of such detailed analysis means that timing problems and race conditions may not be reliably detected. Delay calculations can also be curtailed using "zero-delay" timing for hardware functions. A zero-delay timing system assumes that all events happen without propagation delays or response delays. This assumes that all internal functions in the target microprocessor occur with zero delay and that response from that target circuitry also occur with zero delay. While this approach speeds up the simulation, it does not provides an accurate simulation of the system timing.

Figure 2:
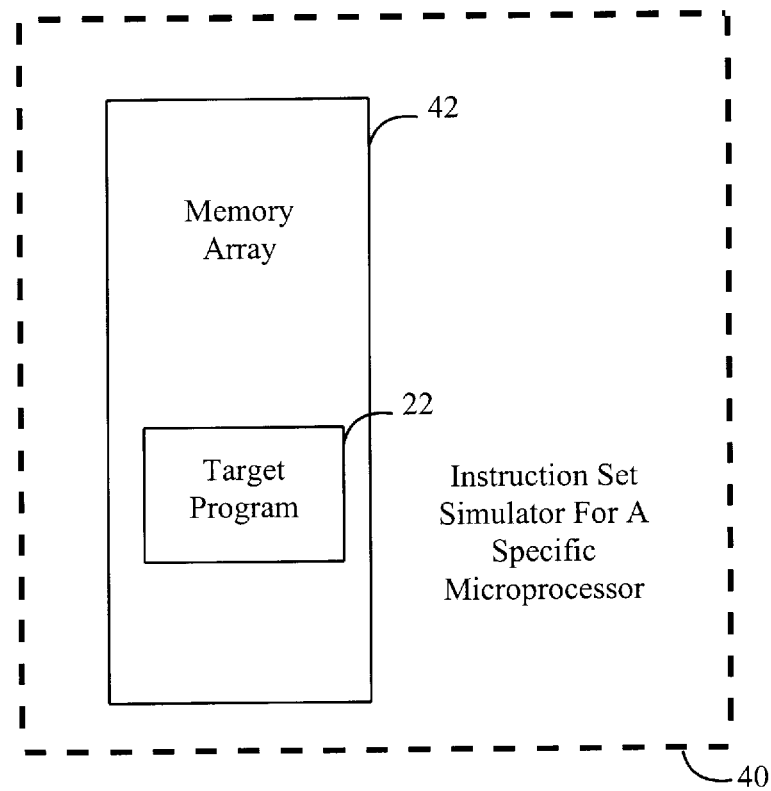
FIG. 2 is a functional block diagram of a conventional instruction set simulator.

Another form of software simulation of the target hardware uses an instruction set simulator (ISS) 40, illustrated in FIG. 2. The ISS 40 includes a memory 42 that contains the target program 22. The ISS 40 strives to guarantee functional accuracy of both instruction functions and memory references only at the processor instruction level. As a result, accuracy to detailed internal timing is sacrificed for speed. The speed of a typical ISS 40 is on the order of 1,000–10,000 microprocessor instructions per second. While the ISS 40 provide a functional model of the target microprocessor, they do not interface with custom designed hardware such as the ASIC. The ISS 40 executes the target program 44, but has only limited visibility to circuitry outside of the target microprocessor. The typical ISS 40 does not represent any custom target circuitry in simulation beyond a register reference, and hence is of limited value to hardware designers.

The systems illustrated in FIGS. 1 and 2 simulate the target hardware completely in software. As is known by those of ordinary skill in the art, software simulation of the target hardware offers relatively low cost and flexibility in altering the simulated target hardware. However, the total software simulation approach suffers from the disadvantages that the target hardware often cannot be completely modeled. In addition, the simulator processing time is enormous for the processor functional model 26 (see FIG. 1) making it difficult or impossible to simulate the complete target program 22.

Figure 3:
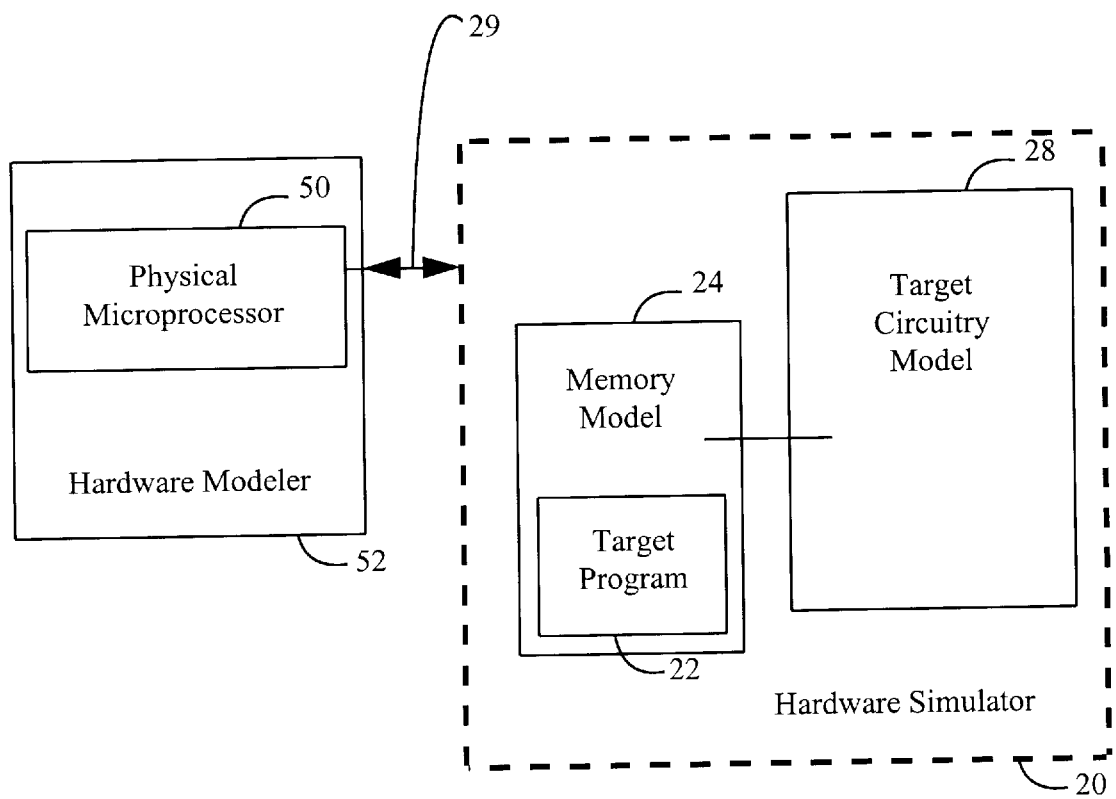
FIG. 3 is a functional block diagram of a traditional hardware simulator employing a hardware modeler to simulate target program execution.

A common technique to address the unacceptably long run-times encountered with the full functional model 26 (see FIG. 1) is to replace the full functional model in the hardware simulator 20 with a physical integrated circuit (IC) microprocessor 50, as illustrated in FIG. 3. The microprocessor 50 is connected to the hardware simulator 20 via a communication link 29 coupling the hardware simulator to a hardware modeler 52. The target program 22 is contained in the memory model 24 in the hardware simulator 20, and all instructions are executed out of the memory model 24, as previously discussed with respect to FIG. 1. A significant difference between the system illustrated in FIG. 1 and that of FIG. 3 is that the processor functional model 26 (see FIG. 1), which is simulated completely in software, is replaced by the physical microprocessor 50 and the hardware modeler 52. The microprocessor 50 may be the actual target microprocessor or other circuit to simulate the behavior of the target microprocessor. It should be noted that the physical microprocessor 50 and the hardware modeler 52 are hardware components rather than software simulations. The cost of the typical hardware modeler 52 can be quite high, ranging from $40,000 to over $200,000.

While the use of the hardware modeler 52 can provide a full functional processor model, regardless of processor complexity, the significant extra cost of the hardware modeler 52 is not always reflected by an increase in simulation performance. The hardware modeler 52 contains a vector memory (not shown) to store the input data for each pin of the physical microprocessor 50 for each time slice of the hardware simulator. A time slice can be arbitrarily small, and is typically less than a single microprocessor clock cycle. As previously discussed, the detection of timing problems requires an event by event analysis, including propagation delays, of the target hardware. The hardware modeler 52 runs lockstep with the hardware simulator 20 with the physical microprocessor 50 generating the next set of binary signals from the vector memory at the microprocessor pin connections for incorporation with the next simulated step of the hardware simulator 20. Thus, the hardware modeler 52 operates in complete synchronization with the hardware simulator 20.

The processor in the hardware modeler 52 is often a dynamic device that must maintain a running clock in order to retain data. Because the hardware simulator 20 simulates the system responses event by event for an arbitrarily small time slice, the physical microprocessor 50 must wait for each simulation cycle to be completed by the hardware simulator 20. Therefore, the physical microprocessor 50 must be reset at the start of each simulation cycle, and all the previous vectors rerun. As the simulations get longer, the time taken to rerun all the previous vectors increases. Executing the target program 22 takes a large number of clock cycles, often exceeding the maximum amount of vector memory available for the hardware modeler 52, and thus severely limiting the length of the target program. In addition to the large memory requirement in the hardware modeler 52, the execution of the target program 22 at the object-code level does not provide a convenient means for debugging the target program 22.

The system illustrated in FIG. 3 uses some hardware, namely the hardware modeler 52, to model portions of the target hardware. However, as discussed above, this approach is both costly and limited in its ability to model the large size of the typical target program 22. Another device used to model the target processor is a processor emulator 60, illustrated in FIG. 4. The processor emulator 60 is a hardware device that substitutes for the target microprocessor. Processor emulators are conventional devices presently available from sources such as Applied Microsystems Corporation. The system illustrated in FIG. 4 includes a portion 62 of the target hardware, including a memory 66 containing the target program 22, and a socket 70 for the target microprocessor. The processor emulator 60 is coupled to the portion 62 of the target hardware by a data bus 72 and typically plugs directly into the socket 70 as a substitute for the target microprocessor.

The processor emulator 60 includes a microprocessor 76, which is typically the target processor. The processor emulator 60 may also include an emulator memory 78 and a control circuit 80. The processor emulator is coupled to a workstation 84 or computer terminal by a communications link 86. The workstation 84 may be a stand-alone computer workstation or simply a terminal coupled to a computer (not shown) to which the processor emulator 60 is also coupled. User interface software 88 within the workstation 84 controls the display of data on the workstation and permits user input to the emulator. The user interface software 88 and the control circuit 80 of the processor emulator 60 are conventional components of the processor emulator and add supplemental control to the prototype hardware system. The user interface software 88 and the control circuit 80 also permit greater debugging capability for the target program 22. This allows the target program 22 to be loaded, started, stopped, examined and modified. The emulator memory 78 contains an emulator control program independent of the target program 22 in the memory 66. However, the target program 22 can also be loaded into the emulator memory 78 in what is sometimes called a memory overlay. Thus, the target program 22 can be executed from the memory 66, the emulator memory 78, or both. Execution of the target program 22 only from the emulator memory 78 allows execution of the target program without the benefit of software interaction with the target circuitry.

A developer can use the processor emulator 60 to replace read-only memory (ROM), which will typically contain the target program in the final production model of the system, with a random access memory (RAM) overlay using the emulator memory 78. The RAM overlay allows the developer to debug the target program 22 even though the target hardware may not be completely available. The typical processor emulator 60 also provides memory mapping software that detects when and where memory cycles occur. This allows the user to single-step through the execution of the target program. The processor emulator 60 also permits interruption of the target program 22 at specified instructions or when certain predefined conditions are met. Such predefined conditions include addresses references, interrupts, I/O instructions, and the like.

The processor emulator facilitates analysis of time-dependent problems in the target system by providing instruction execution trace features, complex breakpoint systems, and memory overlays.

Figure 5:
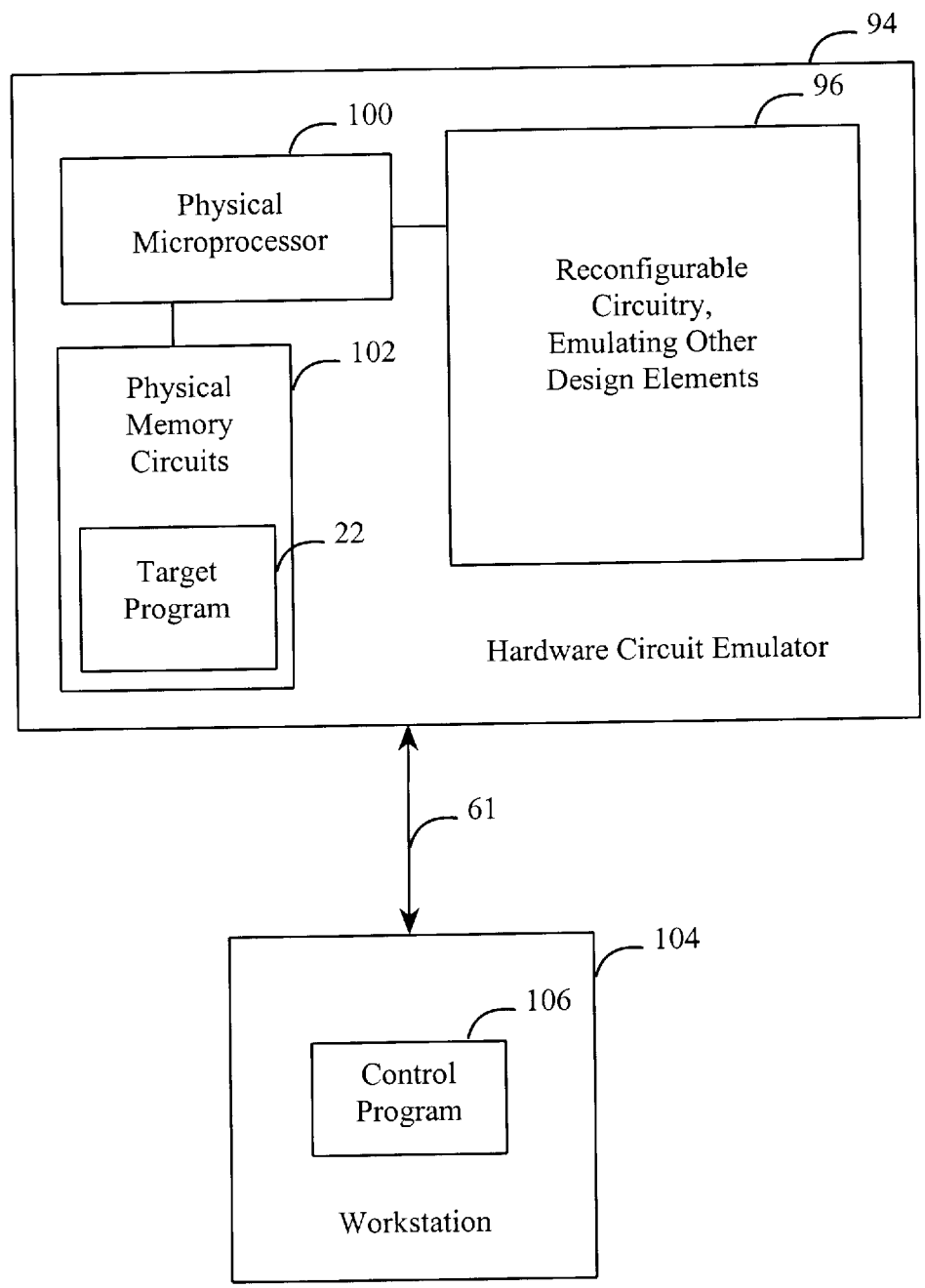
FIG. 5 is a functional block diagram of a conventional hardware circuit emulator.

Another form of hardware emulator, shown in FIG. 5, is a hardware circuit emulator 94. The hardware circuit emulator 94 uses reconfigurable circuitry 96, such as a field-programmable gate array (FPGA), to emulate target circuitry functions including the ASIC or custom IC. Companies such as Quickturn and Aptix have developed hardware circuit emulators which allow hardware designs to be downloaded into the reconfigurable circuitry 96 and mounted on a board-like device. The hardware circuit emulator 94 includes a processor chip 100 and a memory 102 containing the target program 22. The hardware circuit emulator 94 allows the target system to be tested as if it is already built.

The hardware circuit emulator 94 is typically controlled from a computer workstation 104 or computer terminal, which contains a control program 106. The workstation is coupled to the hardware circuit emulator 94 by a data link 61, such as a serial, connection, parallel connection, network connection, or the like. The hardware circuit emulator 94 has the advantages of speed and early breadboard fabrication. However, high cost and tedium in configuration and debugging limit their application. These tools also lack hardware-software debugging visibility because access to internal registers and memory locations is not available.

Figure 4:
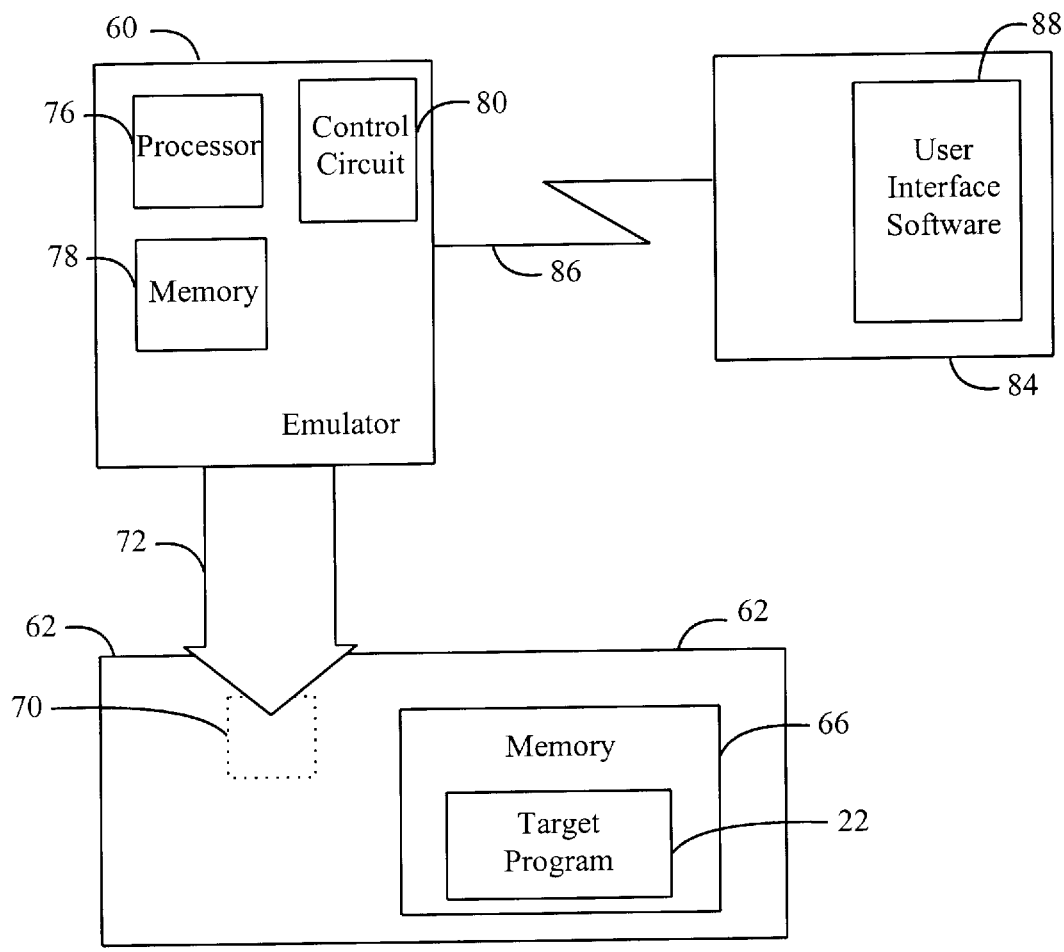
FIG. 4 is a functional block diagram of a conventional processor emulator.

Hardware emulators, such as the processor emulator of FIG. 4 or the hardware circuit emulator 94 of FIG. 5, used to simulate circuit functions typically represent a major investment on the user's part, in both design effort and capital cost. The benefit of using the hardware emulator is in speed of detailed hardware simulation, which approaches the speed of the target system. While the hardware timing is not precise, it is a close approximation. System debugging remains a significant problem with hardware emulators because there is often little consideration of the software engineer. In order to load the design on the hardware emulator, one typically needs to represent the design in a detailed, structural form, which implies that the target hardware design has progressed very far along in the design process. This approach is often a costly development handicap because the development of the target program must await the completion of the target hardware. Thus, use of unsynthesizable behavioral or high-level design representations, typical of early stages of design, are precluded by the use of hardware emulators. By the time that target circuitry prototype is ready for use with hardware emulators, the product development is necessarily very far along in time, often practically precluding the possibility of redesigning an ASIC that is already in place. Waiting for the target circuitry prototype also serializes the target program development process because the software development must await the development of the target circuitry prototype. This serialization of the target program causes unwanted delays in software debugging and system integration.

The present invention allows for the early simulation of the target hardware and permits the parallel development of the target hardware and the target program. The system of the present invention also allows the extensive use of existing debugging tools to aid the developer in the development and integration of the target system. The system combines interacting elements of hardware and executing software, in part by physical emulation and in part by abstract software simulation.

Figure 6:
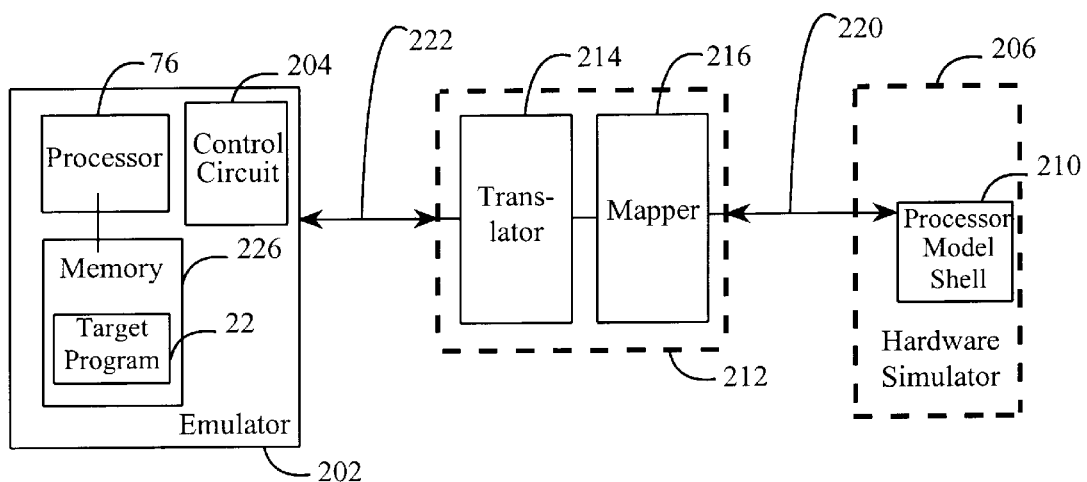
FIG. 6 is a functional block diagram of the present invention.

The present invention is embodied in a system 200 shown in FIG. 6. The system 200 includes a processor emulator 202, such as the microprocessor emulator 60 (see FIG. 4) manufactured by Applied Microsystems Corporation and others. The processor emulator 202 typically includes the target microprocessor itself as the microprocessor 76. However, the microprocessor 76 may be different from the target microprocessor and use additional components such as the FPGA to form a hardware circuit emulation of the target microprocessor. The operation of the processor emulator 202 is similar 5 to that the of the conventional hardware emulators illustrated in FIG. 4 except for the operation of the control circuit 80 (see FIG. 4) and the control program 104 (see FIG. 5), which are replaced by the function of the control circuit 204. The operation of the control circuit 204 in the system 200 will be discussed in detail below.

In the system 200, part of the target hardware is modeled by the processor emulator 202 and part of the target hardware is modeled by a hardware simulator 206. The hardware simulator 206 contains a processor model shell 210, which emulates the actual pin connections for the target microprocessor. The hardware simulator 206 simulates the interaction between the target microprocessor and the target circuitry. To model this interaction, the hardware simulator 206 must simulate the electrical and logical activity of the target circuitry at the pins of the target microprocessor. The processor model shell 210 is not the equivalent of the full functional processor 25 (see FIG. 1), but only models the activity of the target circuitry at the target microprocessor pins. It should be noted that the conventional processor emulator 60 (see FIG. 4) includes the data bus 72 which is physically plugged into the socket 70.

However, the processor emulator 202 of the present invention does not utilize the data bus 72, but rather communicates with the hardware simulator 206 using computer functions, as will be described below.

The processor emulator 202 typically has a first data format that is different from a second data format used by the hardware simulator 206. A software kernel 212 is coupled between the processor emulator 202 and the hardware simulator 206 to convert from the first data format to the second data format. The software kernel 212 includes a translator 214 and a mapper 216. 30 The translator 214 determines the nature of the required interaction and converts the interaction event from the first data format to an intermediate data format while the mapper 216 converts the intermediate data format into the second data format and generates a sequence of events for use at the hardware simulator 206. The operation of the software kernel 212 and its components will be described in detail below. Thus, the translator 214 is specific to the processor emulator 202 while the mapper 216 is specific to the hardware simulator 206. The intermediate data format is a universal protocol that ensures compatibility between all translators 214 and all mappers 216.

The various components of the system 200 may be physically located in proximity with each other, and may even be portions of the same computer system. For example, the hardware simulator 206 and the software kernel 212 are both software components. These elements of the system may be implemented in a single host computer. For the sake of clarity, the host computer is not illustrated herein. However, the hardware simulator 206 and the software kernel 212 may also be implemented by different computer systems. The hardware simulator 206 and the software kernel 212 are coupled together by a communications link 220, which may be a programmatic interface if the hardware simulator and the software kernel are implemented in the same host computer. If the hardware simulator 206 and the software kernel 212 are implemented on separate computer systems, the communications link 220 can be, for example, a serial connection, a parallel connection or a network connection.

Similarly, the processor emulator 202 is coupled to the software kernel 212 by a communications link 222. As described above with respect to the communications link 220, the communications link 222 can be, for example, a serial connection, a parallel connection or a network connection. In the presently preferred embodiment, the communications link 222 from the processor emulator 202 to the software kernel 212, and the communications link 220 from the software kernel to the processor model shell 210 is implemented as a set of TCPIP sockets over an ethernet link. However, as those of ordinary skill in the art can readily appreciate, the communications links 220 and 222 may be implemented with other communications means such as serial and parallel communications ports, fiber optic FDDI links, and others as available. The present invention is not limited by the particular form of the communications links 220 and 222.

The system 200 takes advantage of the combination of modeling of the target microprocessor and the target program in the processor emulator 202 and of the target circuitry in the hardware simulator 206. The system 200 is significantly different from the hardware emulators, such as illustrated in FIGS. 4 and 5 because the system 200 simulates the target circuitry using the hardware simulator 206. This allows the software developer to develop the target program before the target circuitry is developed, unlike the prior art hardware emulators that require the development of the target circuitry.

The system further takes advantage of analysis that indicates that most of the computer instructions executed by the target program do not require interaction with the target circuitry. While the degree of interaction depends entirely on the specific application for which the target system is designed, studies indicate that the typical target program interacts with the target circuitry less than 20% of the time, with the remaining 80% of the time involving interaction between the target program and the target microprocessor. The system 200 uses the processor emulator 202, which is a high speed hardware device, to emulate the target microprocessor and the hardware simulator 206, which is a relatively slow software simulator, to model the target circuitry. Thus, the vast majority of the target program (typically 80% or more) is processed by the high-speed hardware portions of the system 200 while the smaller portions (typically less than 20%) that requires interaction with the target circuitry is processed by the slower software portions of the system. This provides the advantage of high-speed operation of the target program for the portions of the system, such as the target microprocessor, that can be selected early in the design process. The system provides the further advantage of early simulation of the target hardware using the software modeling capability of the hardware simulator 206. Although the hardware simulator 206 is significantly slower than the processor emulator 202, the system 200 does not suffer from the slow instruction execution speed of prior art systems because most instruction are processed by the high-speed processor emulator with no hardware simulator interaction. Also, the complexity of most hardware modeled with a hardware simulator is much less complex than the hardware in the microprocessor.

The software kernel 212 functions as a communications controller when the target program 22 calls for interaction between the target microprocessor and the target circuitry. The translator 214 determines the type of interaction required by the processor emulator 202 and hardware simulator 206 and translates the calls for such interaction from the first data format to the intermediate data format for data going from the processor emulator 202 to the hardware simulator 206, and the mapper 216 converts the data in the intermediate format into the second data format at the hardware simulator 206 and generates a sequence of functions that correspond to the event steps that are required for the hardware simulator to model the event. However, it should be understood that not all calls for interaction between the target microprocessor and the target circuitry are initiated by the target microprocessor. For example, the target circuitry may generate an interrupt to the target microprocessor, which necessitates the transfer of data from the hardware simulator 206 to the processor emulator 202. The mapper 216 and translator 214 operate in both directions to permit complete interaction between the processor emulator 202 and the hardware simulator 206. For data going from the processor emulator 202 to the hardware simulator 206, the translator 214 determines the nature of the event and translates from the first data format to the intermediate data format and the mapper 216 maps the data in the intermediate data format to the second data format and generates the appropriate sequence of functions at the hardware simulator 206. For data going from the hardware simulator 206 to the processor emulator 202, the mapper 216 maps the sequence of functions from the hardware simulator 206 in the second data format into data in the intermediate data format and the translator 214 translates from the intermediate data format to the first data format to determine the nature of the required interaction. Thus, the software kernel 212 controls bidirectional communications and translation between the processor emulator 202 and the hardware simulator 206.

Operational details of the components of the system 200 will now be described. The hardware simulator 206 is used to provide the external hardware response to the target program 22 executing out of a memory 226 associated with the processor emulator 202. While FIG. 6 illustrates the memory 226 as part of the processor emulator 202, the system 200 is not limited to such a memory arrangement. For example the memory 226 containing the target program 22 may exist as part of the processor emulator 202 or may be connected to the data bus 72 (see FIG. 4) in the processor emulator or may be coupled to the processor emulator by other electrical means.

Existing circuit descriptions, including HDL, are used to describe other target circuitry in the target hardware design. The processor model shell 210, using the HDL of the target circuitry, provides the communications and synchronization between the hardware simulator 206 and the software kernel 212. This communications and synchronization is provided in the same manner as the hardware simulator 20 (see FIG. 1) of the prior art and need not be described in greater detail herein.

Examples of the processor operating functions, illustrated in FIG. 7, are defined to facilitate interaction between the processor emulator 202 and the processor model shell 210 in the hardware simulator 206. These processor operating functions include read and write functions for memory and input/output (I/O) operations. When an operation code (opcode) is executed in the target program 22, the processor emulator 202, in cooperation with control circuitry 204, and software contained in the processor emulator recognizes if interaction between the target microprocessor and the target circuitry needs to occur. If no external interaction is required, the target program 22 continues to execute unimpeded within the processor emulator 202. If interaction is required between the processor emulator 202 and the hardware simulator 206, the translator 214, which is a software component, interprets the operation in process and communicates with the mapper 216, to convert the intended opcode operation to defined processor functions. The processor model shell 210 performs the equivalent operation in the hardware simulator 206 to convert the processor function to the simulated activity at the pins of the target microprocessor. For example, if the event requiring interaction between the processor emulator 202 and the hardware simulator 206 is a 32-bit I/O write instruction (function 16 in FIG. 7), the processor emulator generates an I/O trap and the translator 214 fields the trap and determines the type of trap. The translator 214 further converts the particular instruction, the 32-bit I/O write in the present example) into the universal intermediate format. The mapper 216 receives the intermediate format and converts the instruction into a sequence of functions that are in the second format usable by the hardware simulator 206. In the present example, the address and data lines on the processor model shell 210 are changed at the appropriate times to simulate the 32-bit I/O write in the hardware simulator 206. In addition, other lines such as the Read/Write control line must be asserted and deasserted at the appropriate times in the simulation cycles of the hardware simulator. The mapper 216 will generate the various functions that correspond to events that occur in the target processor, but the functions are in the second data format used by the hardware simulator 206.

Those of ordinary skill in the art can appreciate that different instruction types will result in a different sequence or sequences of function calls by the mapper 216.

While the translator 214 determines the nature of the required interaction between the processor emulator 202 and the hardware simulator 206 and translates data between the first data format and the universal intermediate format, such translation is not required. In a preferred embodiment, the mapper 216 determines the nature of the required interaction requested by the target program 22 and directly generates the sequences of functions for the hardware simulator 206. For interaction request by the hardware simulator 206, the mapper 216 performs the reverse process without the need for the translator 214.

When a read function is executed, the data that the processor model shell 210 reads from the hardware simulator 206 is reported back to the target program 22 by reversing the process.

The processor emulator 202 contains both control circuitry 204 and a control program, both residing in the memory 226, which can identify conditions of the executing target program 22 and the surrounding hardware environment which will require communication with the hardware simulator 210. These conditions include explicit memory references outside of the loaded target program address range, input/output (I/O) operations, interrupt handling, and instructions dealing with explicit hardware functions, such as RESET. Those skilled in the art will recognize that other instruction may also require such interaction with the hardware simulator 206 The control circuitry 204 in the processor emulator 202 provides hardware capability to detect events requiring the interaction of the target microprocessor and the target circuitry. Similarly, the control program residing in the memory 226 provides software capability to detect events requiring the interaction of the target microprocessor and the target circuitry.

Because most of the target program 22 is executing unimpeded out of the memory 226 on the processor 76 in the processor emulator 202, there is no requirement for the processor model shell 210 to execute bus cycles such as instruction fetches in the hardware simulator 206. Thus, the hardware simulator 206 is not synchronized to the processor emulator 202 except when there is an event requiring interaction between the target microprocessor and the target circuitry. This means that when looking at data from the hardware simulator 206 such as signal waveforms, the timing cycles in the processor model shell 210 are precisely timing accurate because there is synchronization during events requiring interaction between the target microprocessor and the target circuitry. Furthermore, the execution time between cycles of the target program 22 will be fast when there is no event requiring interaction between the target microprocessor and the target circuitry. However, the sequence of executed cycles is correct at all times, and the tasks performed by the target program 22 are functionally correct. Further, no modification of the target program 22 by the user is needed, at the source level or object code level to operate with the system 200.

Another significant advantage of the system 200 is that conventional development tools that run on the target processor can be used with the target program 22. For example, conventional software debuggers, operating systems, and the like can be used with the target program 22 in a normal fashion. Thus, the system developer can utilize all the conventional development tools to assist in the development of the target program. This is unlike prior art systems, such as the hardware simulator 20 (see FIG. 1) where the system developer cannot use debugging tools.

This system 200 is capable of handling hardware interrupts to the target program 22. Interrupts received by the processor model shell 210 within the hardware simulator 206 are communicated to the software kernel 212 and translated as an interrupt to the target program 22. Within the target program 22, the programmer can create an interrupt handler, which is invoked asynchronously on receipt of an interrupt. Facilities exist for interrupt masking, fully supporting the hardware equivalent found in the target system. These facilities ensure that the system 200 is compatible with interrupt driven code.

Figure 8A:
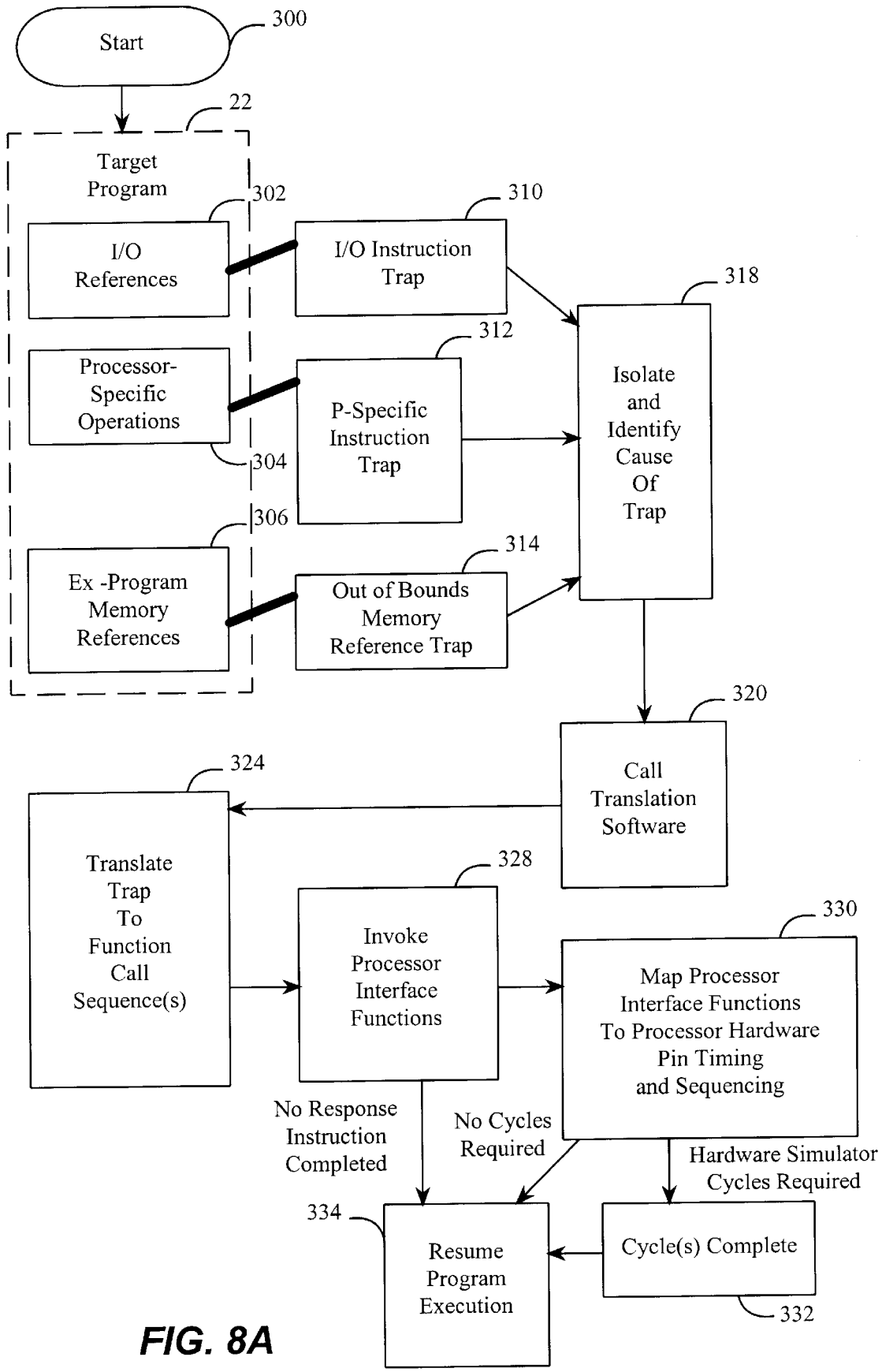
FIGS. 8A and 8B are flowcharts illustrating the operation of the control program in the present invention.
Figure 8B:
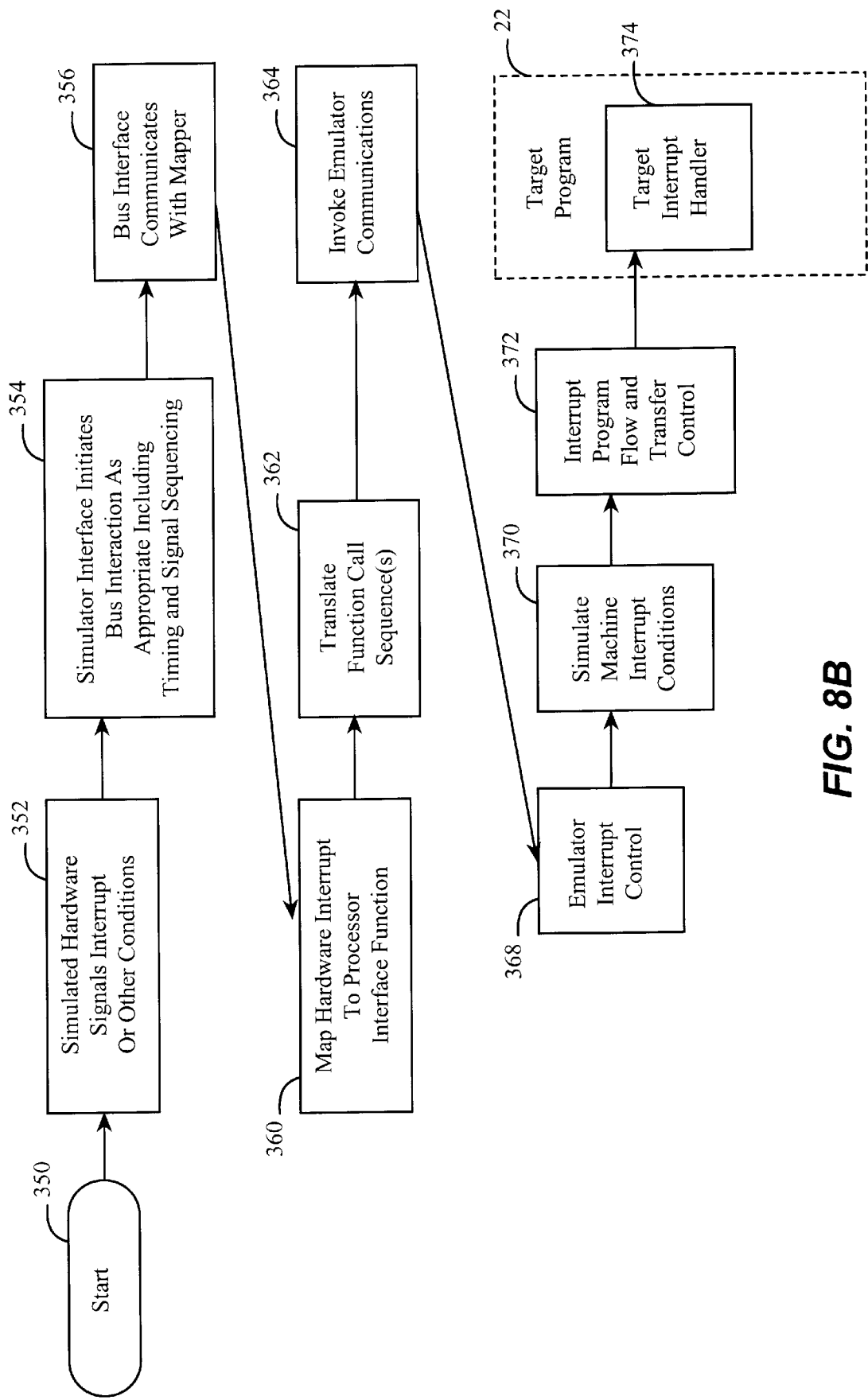

The operation of the system 200 is illustrated in the flowcharts of FIGS. 8A and 8B. FIG. 8A illustrates the operation of the system 200 when the interaction between the target microprocessor and the target circuitry is initiated by the target microprocessor. At the start 300 the target program 22 is executing on the processor emulator 202 (see FIG. 6). The target program 22 typically contains an I/O reference instruction 302, a processor specific operation 304, and an external program memory reference 306. It should be noted that it is not essential to the operation of the system 200 that the target program 22 contain all of the elements described above. When the target program 22 executes an I/O reference instruction 302, the system 200 generates an I/O instruction trap in step 310. Similarly, if the target program 22 executes a processor specific operation 304, the system generates a processor specific operation trap in step 312. If the target program 22 executes an external program memory reference 306, the system generates an out of bounds memory reference trap in step 314.

In step 318, the system 200 isolates and identifies the cause of the trap generated in steps 310, 312, or 314. In step 320, the system 200 calls the translation software in the translator 214 (see FIG. 6). In step 324, the translator 214 translates the trap to a function call sequence or sequences. In step 328, the software kernel 212 invokes a processor interface function.

Certain processor interface functions, such as breakpoint, an instruction trace, or memory reference to a location inside the emulator 202 (see FIG. 6), require no response from the target circuitry. In this case, the system 200 moves to step 334 and resumes normal program execution of the target program 22. Other processor interface functions, such as an I/O Read instruction, require a response from the target circuitry. In this event, the mapper 216 maps the processor interface function to the appropriate processor hardware pin timing and sequencing in step 330. Some interface fuictions, such as setting the interrupt mask register, require no simulator cycles in the hardware simulator 206. The system 200 merely sets the interrupt mask register in the processor model shell 210, which completes the task without requiring the hardware simulator to execute any simulator cycles. In this event, the system jumps to step 334 and resumes normal program execution. Other processor interface functions, such as an I/O Read or I/O Write, require one or more cycles in the hardware simulator 206. In this case, the system, in step 332, completes the hardware simulation cycles required by the specific interface function using the hardware simulator 206 in the manner described above. When the hardware simulator 206 has completed the required cycles, the system 200 moves to step 334, and resumes normal execution of the target program 22. Thus, the system 200 responds to various instructions in the target program 22 that require interaction with the target circuitry simulated in the hardware simulator 206.

As previously discussed, the target circuitry may also initiate an event requiring interaction between the target microprocessor and the target circuitry. This is illustrated in FIG. 8B, where at the start 350, the target program 22 (see FIG. 6) is executing on the processor emulator 202. In step 352, the target circuitry, simulated on the hardware simulator 206 (see FIG. 6), signals an interrupt or other condition, such as Power On, RESET, Bus Error, Address Error, Memory Fault, Non-Maskable Interrupt, and the like, requires interaction between the target circuitry and the target microprocessor. In step 354, the simulator interface, using the processor model shell 210, initiates a bus action corresponding to the particular interrupt or condition. This includes the generation of both timing and signal sequencing to simulate the activity of the target circuitry. In step 356, the processor model shell 210 communicates with the mapper 216. In step 360, the mapper 216 connects the hardware interrupt to a processor interface function. In step 362, the translator 214 translates the interface function to a call sequence or sequences. In step 364, the system invokes an emulator communications call.

In step 368, the system 200 transfers the call sequence to the emulator interrupt control. In step 370, the processor emulator 202 (see FIG. 6) simulates a machine interrupt condition. In step 372, the processor emulator 202 interrupts the normal flow of the target program 22 and transfers control to an interrupt handler in the target program. In step 374, the target program 22 processes the target interrupt using the target interrupt handler. Upon completion of the target interrupt processing, the system 200 returns control to the target program 22, which continues normal program processing. Thus, as illustrated in FIGS. 8A and 8B, the system 200 processes requests for interaction between the target microprocessor and the target circuitry regardless of which portion of the target system initiated the event requiring such interaction.

The system 200 also supports split execution across a network, computer workstation to computer workstation. This is especially important for design groups where the hardware designers work with tools that run on one platform type, and the software designers work with tools that run on different platform type. With the system 200, the hardware simulator 206 can execute on the hardware designer's workstation, and the software kernel 212 can execute on the software engineers' machines. The target program 22, along with debuggers and other software development tools, execute on the processor emulator 202, which is a network sharable resource. In this manner, it is possible to run the software and hardware debuggers simultaneously, allowing both hardware and software analysis at will. Thus, the system 200 is not limited to execution of a single platform, but permits simultaneous development by a number of different development groups in different physical locations sharing resources on communications links such as a network.

Figure 9:
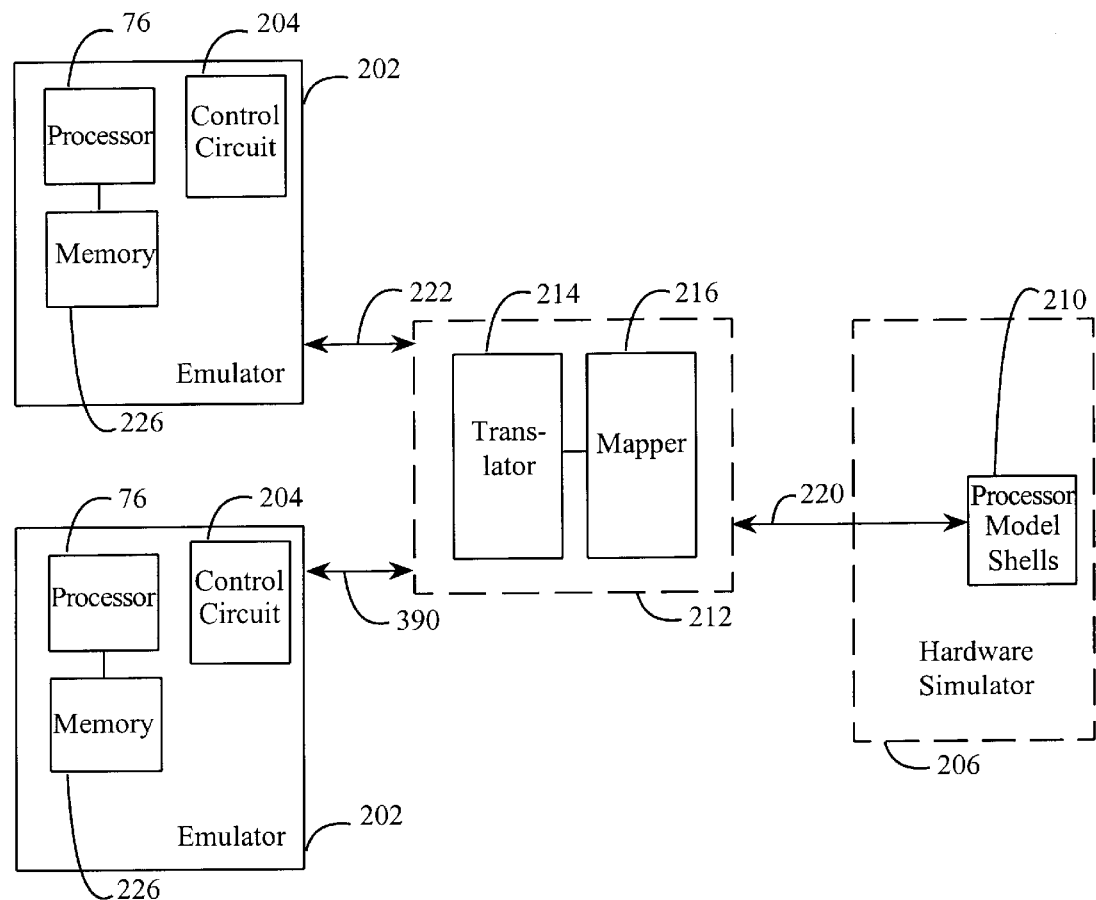
FIG. 9 is a functional block diagram of a dual processor configuration of the present invention employing two processor emulators.

In another embodiment of the system 200, multiple processor emulators 202 can support simultaneous target programs executing concurrently, as illustrated in FIG. 9. Each processor emulator 202 maintains synchronization locally and executes its own target program 22 (see FIG. 6). If one processor emulator 202 is waiting for something to happen, this does not prevent another processor emulator from executing independently. The functions performed by the software kernel 212 and the processor model shell 210 in the hardware simulator 206 are identical to that previously described with respect to the system of FIG. 6 except that the software kernel is coupled to two processor emulators 202. A communications link 390 couples the software kernel 212 to the additional processor emulator 202. While the system illustrated in FIG. 9 includes only two processor emulators 202, there are no restrictions on the number of processor emulators that can be included within the system 200. It should be noted that the processor emulators 202 may use different target microprocessors.

Figure 10:
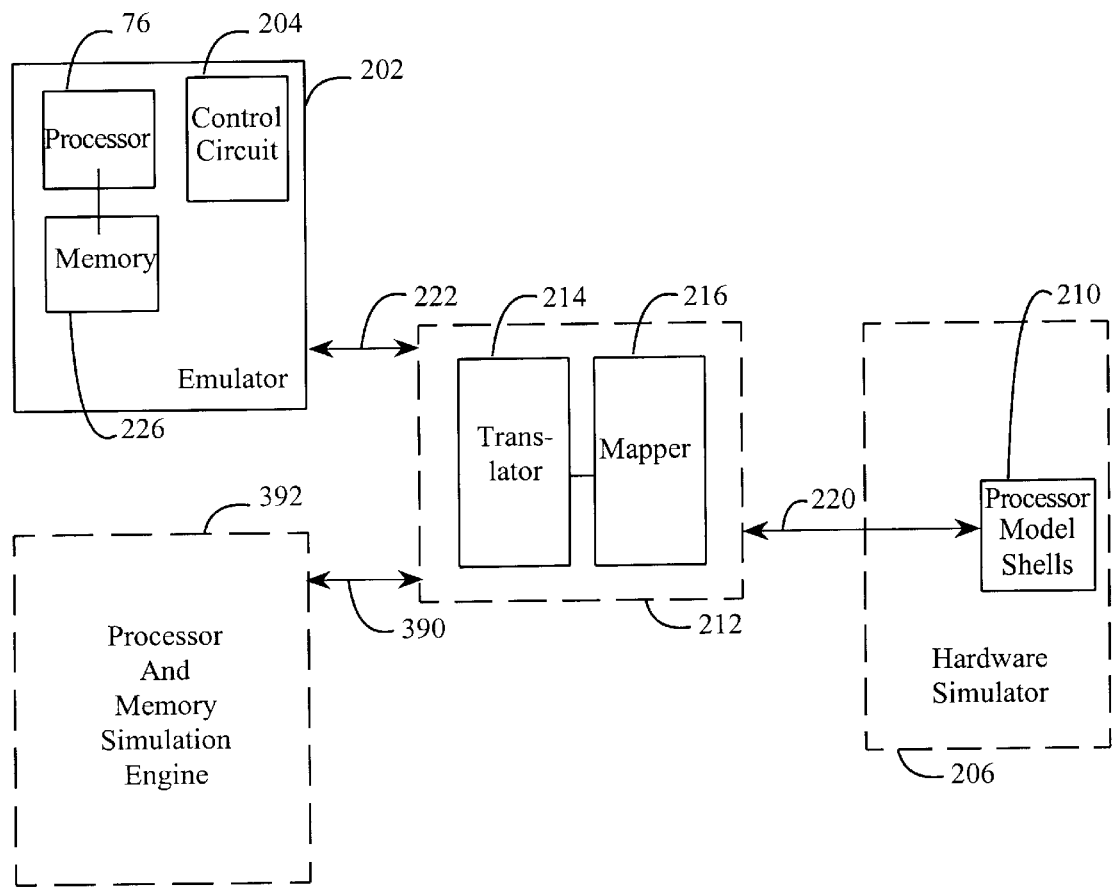
FIG. 10 is a block diagram of a dual processor configuration of the present invention employing a processor emulator and a software processor simulation engine.

In another embodiment, illustrated in FIG. 10, the system 200 uses a processor and memory simulation engine 392 in place of the second processor emulator 202 described in FIG. 9. The processor and memory simulation engine 392 may, for example, be the ISS 40 (see FIG. 2). The processor and memory simulation engine 392 communicates with the software kernel 212 in the manner described above with respect to FIGS. 6 and 9. While the processor and memory simulation engine 392 may not provide the detailed internal timing and debugging capabilities of the processor emulator 202, it can provide the functionality of the target microprocessor.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited only by the appended claims.

What is claimed is:

1. A system for testing and analyzing electronic systems, including a target microprocessor and simulated target circuitry, and accompanying target program to be executed on the target microprocessor, the system comprising:

a memory storing a plurality of computer instructions, said computer instructions including the target program;

a processor emulator employing a hardware device for emulating the target microprocessor, said processor emulator coupled to said memory to execute said computer instructions;

a hardware simulator coupled to said processor emulator to simulate the target circuitry; and a communications interface to control communication between said processor emulator and said hardware simulator, said processor emulator communicating with said memory to receive said computer instructions from said memory, and said processor emulator communicating with said hardware simulator using said communications interface only when an event requires interaction of the target program with the target circuitry.

2. The system of claim 1 wherein said processor emulator is coupled to said hardware simulator by a computer network connection, said communications interface controlling communications over said network.

3. The system of claim 1, further including an exception detector coupled to said processor emulator to detect said event requiring the target program to interact with the target circuitry.

4. The system of claim 3 wherein said exception detector temporarily halts execution of said plurality of computer instructions while said hardware simulator processes said event requiring the target program to interact with the target circuitry.

5. The system of claim 1 wherein said event requiring the target program to interact with the target circuitry is an input/output (I/O) instruction to said hardware simulator, and said communication interface controls communication of said I/O instruction from said processor emulator to said hardware simulator.

6. The system of claim 1 wherein said processor emulator uses a first data format and said hardware simulator uses a second data format, the system further including a translator to convert said event requiring the target program to interact with the target circuitry from said first data format to one or more function calls in said second data format.

7. The system of claim 6 wherein said hardware simulator contains a processor model shell to simulate activity of the pins of the target microprocessor, the system further including a mapper to map said function calls from said second data format to a set of signal sequences compatible with the processor model shell.

8. The system of claim 7, further including a computer communicating with said processor emulator, said computer also executing said hardware simulator, said translator, and said mapper.

9. The system of claim 7 wherein said processor emulator is coupled to said translator and said mapper by a first computer network connection, said communications interface controlling communication over said first network connection.

10. The system of claim 9, wherein said translator and said mapper are coupled to said hardware simulator by a second computer network connection, said communications interface controlling communication between said processor emulator and said hardware simulator over said first and second network connections.

11. The system of claim 1 wherein said processor emulator is a microprocessor emulator with said memory integrated therein, said integrated memory containing said computer instructions.

12. The system of claim 1 wherein said processor emulator is a hardware circuit emulator with said memory integrated therein, said integrated memory containing said computer instructions.

13. The system of claim 1, further including a computer communicating with said processor emulator, said computer also executing said hardware simulator.

14. The system of claim 1 wherein said hardware simulator contains a processor model shell to simulate activity of the pins of the target microprocessor, the system further including a mapper to map said event requiring the target program to interact with the target circuitry to a set of signal sequences compatible with the processor model shell.

15. The system of claim 14, further including a computer communicating with said processor emulator, said computer also executing said hardware simulator and said mapper.

16. A system for testing and analyzing electronic systems, including first and second target microprocessors and simulated target circuitry, and accompanying target program to be executed on each of the target microprocessors, the system comprising:

a first memory storing a first set of computer instructions for the first target microprocessor, said first set of computer instructions including the target program for the first target microprocessor;

a first processor emulator employing a hardware device for emulating the first target microprocessor, said first processor emulator coupled to said first memory to execute said first set of computer instructions;

a second memory storing a second set of computer instructions for the second target microprocessor, said second set of computer instructions including the target program for the second target microprocessor;

a second processor emulator employing a hardware device for emulating the second target microprocessor, said second processor emulator coupled to said second memory to execute said second set of computer instructions;

a hardware simulator coupled to said first and second processor emulators to simulate the target circuitry; and a communications interface to control communication between said first and second processor emulators and said hardware simulator, said first and second processor emulators communicating with said first and second memories, respectively, to receive said first and second sets of computer instructions from said first and second memories, said first processor emulator communicating with said hardware simulator using said communications interface only when an event requires interaction of the target program for the first target microprocessor with the target circuitry, and said second processor emulator communicating with said hardware simulator using said communications interface only when an event requires interaction of the target program for the second target microprocessor with the target circuitry.

17. The system of claim 16 wherein said communications controller has first and second portions, said first communications controller portion being operatively coupled to said first processor emulator to control communications between said first processor emulator and said hardware simulator only on said event when the target program for the first target microprocessor requires interaction with the target circuitry, said second communications controller portion being operatively coupled to said second processor emulator to control communications between said second processor emulator and said hardware simulator only on said event when the target program for the second target microprocessor requires interaction with the target circuitry.

18. The system of claim 16 wherein said first and second processor emulators are each coupled to said hardware simulator by a computer network connection, said communications interface controlling communications over said network connections.

19. The system of claim 16, further including first and second exception detectors coupled to said first and second processor emulators, respectively, said first exception detector detecting said event when the target program for the first target microprocessor requires interaction with the target circuitry, and said second exception detector detecting said event when the target program for the second target microprocessor requires interaction with the target circuitry.

20. The system of claim 19 wherein said first exception detector temporarily halts execution of said first set of computer instructions while said hardware simulator processes said event when the target program for the first target microprocessor requires interaction with the target circuitry, and said second exception detector temporarily halts execution of said second set of computer instructions while said hardware simulator processes said event when the target program for the second target microprocessor requires interaction with the target circuitry.

21. The system of claim 16 wherein said event when the target program for the first target microprocessor requires interaction with the target circuitry is an input/output (I/O) instruction to said hardware simulator, and said communication interface controls communication of said I/O instruction from said first processor emulator to said hardware simulator.

22. The system of claim 16 wherein said event when the target program for the second target microprocessor requires interaction with the target circuitry is an input/output (I/O) instruction to said hardware simulator, and said communication interface controls communication of said I/O instruction from said second processor emulator to said hardware simulator.

23. The system of claim 16 wherein said first and second processor emulators use a first data format and said hardware simulator uses a second data format, the system further including a translator to convert said events when the target program for the first and second target microprocessors require interaction with the target circuitry from said first data format to one or more function calls in said second data format.

24. The system of claim 23 wherein said hardware simulator contains first and second processor model shells to simulate activation of the pins of the first and second target microprocessors, respectively, the system further including a mapper to map said function calls for the first target microprocessor from said second data format to a set of signal lines compatible with said first processor model shell, and to map said function calls for the second target microprocessor from said second data format to a set of signal sequences compatible with said second processor model shell.

25. The system of claim 24, further including a computer communicating with said first and second processor emulators, said computer also executing said hardware simulator, said translator, and said mapper.

26. The system of claim 23 wherein said first and second processor emulators are coupled to said translator by a first computer network connection, said communications interface controlling communication over said first network connection.

27. The system of claim 26 wherein said translator is coupled to said hardware simulator by a second computer network connection, said communications interface controlling communication between said processor emulator and said hardware simulator over said first and second network connections.

28. The system of claim 16 wherein said first and second processor emulators are microprocessor emulators with said first and second memories, respectively, integrated therein, said first integrated memory storing said first set of computer instructions for the first target microprocessor, and said second integrated memory storing said second set of computer instructions for the second target microprocessor.

29. The system of claim 16 wherein said first and second processor emulators are hardware circuit emulators with said first and second memories, respectively, integrated therein, said first integrated memory storing said first set of computer instructions for the first target microprocessor, and said second integrated memory storing said second set of computer instructions for the second target microprocessor.

30. The system of claim 16, further including a computer communicating with said first and second processor emulators, said computer also executing said hardware simulator.

31. The system of claim 16 wherein said hardware simulator contains first and second processor model shells to simulate activity of the pins of the first and second target microprocessors, respectively, the system further including a mapper to map said event requiring the target program for the first target microprocessor to interact with the target circuitry to a set of signal sequences compatible with the first processor model shell, said mapper also mapping said event requiring the target program for the second target microprocessor to interact with the target circuitry to a set of signal sequences compatible with the second processor model shell.

32. The system of claim 31, further including a computer communicating with said processor emulator, said computer also executing said hardware simulator and said mapper.

33. A system for testing and analyzing a electronic systems, including a target microprocessor and a target program to be executed on the target microprocessor, and simulated target circuitry simulated on a hardware simulator, the system comprising:
 a processor emulator employing a hardware device for emulating the target microprocessor, said processor emulator including a memory for storing and executing the target program;
 a processor model shell substituting for a processor model in the hardware simulator; said processor model shell simulating activity of the pins of the target microprocessor;
 interaction detection means coupled to the processor emulator and said processor model shell, said interaction detection means recognizing, in cooperation with said processor emulator, when the target program needs to interact with the target circuitry in the hardware simulator; and
 a communication link coupling said processor model shell to said interaction detection means and coupling said interaction detection means to said processor emulator, whereby the system simulates the functional behavior of the target microprocessor executing target programs acting in conjunction with simulated target circuitry.

34. The system of claim 33 wherein said interaction detection means includes a software kernel communicating with the processor emulator and said processor model shell to detect when the target program needs to interact with the target circuitry in the hardware simulator.

35. The system of claim 34 wherein said software kernel translates operational requests from the target program requiring interaction with the target circuitry in the hardware simulator and maps said operational requests into processor functions for communication to said processor model shell.

36. The system of claim 34 wherein said software kernel maps hardware generated requests from said processor model shell requiring interaction with the target program, said software kernel translating and communicating said hardware generated requests to the target program in said processor emulator.

37. The system of claims 34 for operation with external computers wherein said hardware simulator is executed by a first of the external computers and said software kernel is executed by a second of the external computers.

38. The system of claim 34 wherein said software kernel comprises a plurality of logical functions, said logical functions being distributed as control program elements in said processor emulator control software, and as part of said processor model shell operating in conjunction with the hardware simulator.

39. The system of claim 34, further including a computer communicating with said processor emulator, said computer also executing the hardware simulator, including said processor model shell, and said software kernel.

40. The system of claim 33 wherein said processor emulator includes hardware control circuitry and control software and said interaction detection means uses said control circuitry to selectively recognize when the target program needs to interact with the target circuitry in the hardware simulator, said control circuitry interrupting execution of the target program when the target program needs to interact with the target circuitry in the hardware simulator and otherwise allowing uninterrupted execution of the target program.

41. The system of claim 33 wherein said processor emulator includes control circuitry and control software and said interaction detection means uses said control software to selectively recognize when the target program needs to interact with the target circuitry in the hardware simulator, said control software interrupting execution of the target program when the target program needs to interact with the target circuitry in the hardware simulator and otherwise allowing uninterrupted execution of the target program.

42. The system of claim 33 wherein the hardware simulator and said processor model shell are executed on a computer workstation and said communication link controls communication between said emulator and said workstation.

43. The system of claim 33 wherein said processor emulator is a microprocessor emulator with memory integrated therein, said integrated memory containing the target program, said microprocessor emulator communicating with said interaction detection means acting in conjunction with the simulated target circuitry.

44. The system of claim 33 wherein said processor emulator is a hardware circuit emulator with memory integrated therein, said integrated memory containing the target program, said hardware emulator communicating with said interaction detection means acting in conjunction with the simulated target circuitry.

45. The system of claim 33 wherein said communication link supports TCPIP socket protocols.

46. The system of claim 33 wherein said communication link coupling said processor model shell to said software kernel and coupling said software kernel to said processor emulator are software program calls.

47. The system of claim 33 wherein said processor emulator means is a microprocessor emulator with integrated memory contained therein, the system further including external memory coupled to said microprocessor emulator through a microprocessor bus connection with the target program contained in a program memory comprising at least one of said integrated and external memories.

48. The system of claim 47 wherein the target program is contained in both said integrated and external memories.

49. The system of claim 33, further including an additional processor emulator employing a hardware device for emulating an additional target microprocessor, said additional processor emulator including an additional memory for storing and executing a target program to be executed on said additional target microprocessor wherein said software kernel recognizes, in cooperation with said additional processor emulator, when said target program to be executed on said additional target microprocessor needs to interact with the target circuitry in the hardware simulator.

50. A system for testing and analyzing a computer system, including a processor emulator employing a hardware device for emulating a target microprocessor, said processor emulator including a memory for storing and executing a target program to be executed on the target microprocessor, and simulated target circuitry simulated on a hardware simulator, the system comprising:

a software kernel communicating with the processor emulator and the hardware simulator, said software kernel recognizing, in cooperation with the processor emulator, when the target program needs to interact with the target circuitry in the hardware simulator; and a communication link coupling the hardware simulator to said software kernel and coupling said software kernel to the processor emulator, whereby the system simulates the functional behavior of the target microprocessor executing target programs acting in conjunction with simulated target circuitry.

51. A system for testing and analyzing a computer system, including a processor emulator employing a hardware device for emulating a target microprocessor, said processor emulator including a memory for storing and executing a target program to be executed on the target microprocessor, and simulated target circuitry simulated on a hardware simulator, the system comprising:

a software kernel communicating with the processor emulator and the hardware simulator, said software kernel recognizing, in cooperation with the processor emulator, when the executing target program needs to interact with the target circuitry in the hardware simulator, said target program and said hardware simulator otherwise executing in parallel; and a communication link coupling the hardware simulator to said software kernel and coupling said software kernel to the processor emulator, whereby the system simulates the functional behavior of the target microprocessor executing target program acting in conjunction with simulated target circuitry.

52. The method of claim 51, further including the step of detecting said event when the target microprocessor needs to interact with the target circuitry using an exception detection software routine.

53. The method of claim 51 wherein said event when the target microprocessor needs to interact with the target circuitry is an input/output (I/O) instruction to said hardware simulator, and said set of controlling communication, controls communication of said I/O instruction from said processor emulator to said hardware simulator.

54. The method of claim 51 wherein said processor emulator uses a first data format and said hardware simulator uses a second data format, the method further including the step of converting said event when the target microprocessor needs to interact with the target circuitry from said first data format to one or more functions in said second data format.

55. The method of claim 54 wherein said hardware simulator contains a processor model shell to simulate activity of the pins of the target microprocessor, the method further including the step of mapping said functions in said second data format to a set of signal sequences compatible with the processor model shell.

56. The method of claim 55 for use with a computer communicating with said processor emulator, wherein said computer also performs said steps of simulating the target circuitry using said hardware simulator, converting said event, and mapping.

57. The method of claim 55 wherein said processor emulator is coupled to said translator and said mapper by a first computer network connection and said step of controlling communications controls communications over said first network connection.

58. The method of claim 56 wherein said translator and said mapper are coupled to said hardware simulator by a second computer network and said step of controlling communications controls communications over said second network connection.

59. The method of claim 51 for use with a computer communicating with said processor emulator, wherein said computer also performs said step of simulating the target circuitry using said hardware simulator.

60. The method of claim 51 wherein said hardware simulator contains a processor model shell to simulate activity of the pins of the target microprocessor, the method further including the step of mapping said event requiring the target program to interact with the target circuitry to a set of signal sequences compatible with the processor model shell.

61. The method of claim 60 for use with a computer communicating with said processor emulator, wherein said computer also performs said step of simulating the target circuitry using said hardware simulator and said step of mapping.

62. The method of claim 51 for use with an additional processor emulator employing a hardware device for emulating an additional target microprocessor, the additional processor emulator including an additional memory for storing and executing a target program to be executed on the additional target microprocessor, the method further including the steps of controlling communication between the additional memory, the additional processor emulator and said hardware simulator, the additional processor emulator communicating with the additional memory to receive computer instructions, including the target program to be executed on the additional target microprocessor, from the additional memory, and the additional processor emulator communicating with said hardware simulator only on an event when the additional target microprocessor needs to interact with the target circuitry.

* * * * *